United States Patent
Kapoor et al.

(10) Patent No.: US 6,898,734 B2
(45) Date of Patent: May 24, 2005

(54) I/O STRESS TEST

(75) Inventors: Shakti Kapoor, Austin, TX (US); Prashanth Kumar Adamane, Bangalore (IN)

(73) Assignee: International Business Machines Corporation, Armonk, NY (US)

( * ) Notice: Subject to any disclaimer, the term of this patent is extended or adjusted under 35 U.S.C. 154(b) by 491 days.

(21) Appl. No.: 10/015,229

(22) Filed: Dec. 13, 2001

(65) Prior Publication Data

US 2003/0115385 A1 Jun. 19, 2003

(51) Int. Cl.$^7$ ................................................ G06F 11/26
(52) U.S. Cl. ............................ 714/25; 714/30; 710/7
(58) Field of Search ............................ 714/30, 25, 43, 714/739; 710/7, 9, 22

(56) References Cited

U.S. PATENT DOCUMENTS

| | | | |
|---|---|---|---|
| 4,901,259 A | 2/1990 | Watkins | 364/578 |
| 5,440,697 A | 8/1995 | Boegel et al. | 395/500 |
| 5,465,106 A | 11/1995 | Keech et al. | 345/204 |
| 5,717,903 A | 2/1998 | Bonola | 395/500 |
| 5,799,169 A | 8/1998 | Kalapathy | 395/500 |
| 5,963,736 A | 10/1999 | Sarno et al. | 395/500.48 |
| 5,991,529 A * | 11/1999 | Cox et al. | 703/9 |
| 6,110,218 A * | 8/2000 | Jennings | 703/22 |
| 6,120,551 A | 9/2000 | Law et al. | 716/17 |
| 6,125,412 A | 9/2000 | Picard et al. | 710/48 |
| 6,151,641 A * | 11/2000 | Herbert | 710/22 |

OTHER PUBLICATIONS

IBM Technical Disclosure Bulletin, "Microprocessor–Based Attachement Device to a Hardware Stimulator", vol. 34, No. 3, Aug. 1991.

* cited by examiner

*Primary Examiner*—Scott Baderman
*Assistant Examiner*—Anne L. Damiano
(74) *Attorney, Agent, or Firm*—Duke W. Yee; Mark E. McBurney; Betty Formby

(57) ABSTRACT

The present invention provides a method, computer program product, input/output device, and computer system for stress testing the I/O subsystem of a computer system. An input/output device capable of engaging in repetitive direct memory access (DMA) transfers with pseudo-randomized transfer parameters is allowed to execute multiple DMA transfers with varying parameters. In this way, a single type of device may be used to simulate the effects of multiple types of devices. Multiple copies of the same I/O device may be used concurrently in a single computer system along with processor software to access the same portions of memory. In this way, false sharing, true sharing may be effected.

31 Claims, 2 Drawing Sheets

I/O STRESS TEST

BACKGROUND OF THE INVENTION

1. Technical Field

The present invention relates generally to computer software and, more particularly, to stressing and testing an input/output subsystem of a computer system.

2. Description of Related Art

Modern computer systems rely on a large number of input/output (I/O) devices, for exchanging data with human users, for storing data, and for communicating with other computer systems, among other tasks. In many computer systems, I/O is performed through the use of I/O cards that plug into slots connected to a backplane bus, such as a peripheral component interconnect (PCI) bus. These different I/O cards have varying features and capabilities. For this reason, many permutations and combinations of I/O cards may be possible within a single computer system. With the potential use of such a large number of I/O cards, it is a significant challenge to test a computer I/O subsystem. Furthermore, it is not always possible to foresee and predict all of the I/O cards that need to be used on a given bus system. This is especially apparent if the bus associated with the I/O subsystem is an open industry standard bus system like PCI. Thus there is a need to be able to easily test computer I/O subsystem by subjecting such subsystems to a variety of different "irritations" representative of a large number of combinations and permutations of possible I/O devices within the system.

SUMMARY OF THE INVENTION

The present invention provides a method, computer program product, input/output device, and computer system for stress testing the I/O subsystem of a computer system. An input/output device capable of engaging in repetitive direct memory access (DMA) transfers with pseudo-randomized transfer parameters is allowed to execute multiple DMA transfers with varying parameters. In this way, a single type of device may be used to simulate the effects of multiple types of devices. Multiple copies of the same I/O device may be used concurrently in a single computer system along with processor software to access the same portions of memory. In this way, false sharing, true sharing may be effected.

BRIEF DESCRIPTION OF THE DRAWINGS

The novel features believed characteristic of the invention are set forth in the appended claims. The invention itself, however, as well as a preferred mode of use, further objectives and advantages thereof, will best be understood by reference to the following detailed description of an illustrative embodiment when read in conjunction with the accompanying drawings, wherein:

DETAILED DESCRIPTION OF THE PREFERRED EMBODIMENT

Figure 1:
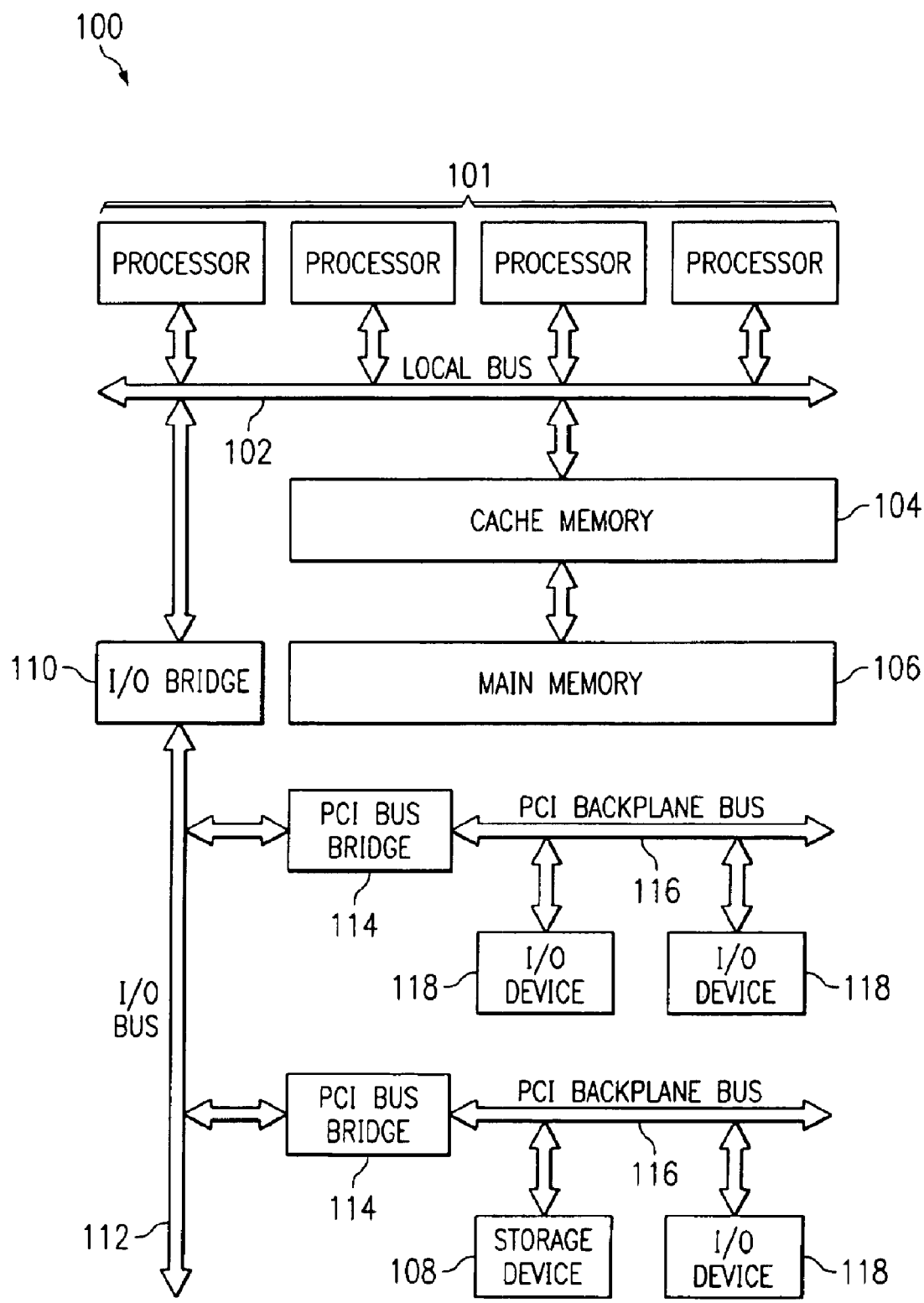
FIG. 1 is a block diagram of a computer system in which the present invention may be implemented.

FIG. 1 is a block diagram depicting a computer system 100 in which a preferred embodiment of the present invention may be implemented. A number of processors 101 reside on a local bus 102, as well as a cache memory 104, which serves as a high-speed temporary storage location for data located in main memory 106. Processors 101 process functional descriptive material that is encoded into a computer-readable medium such as main memory 106. Functional descriptive material may include, but is not limited to, computer programs and information structures. Functional descriptive material may comprise a set of instructions, or they may comprise constraints, rules, or other constructs imparting functionality to computer system 100 when processed by processors 101.

For example, processors 101 may realize the functionality of functional descriptive material comprising a set of program instructions by executing the set of program instructions in sequence. As another example, processors 101 may realize the functionality of functional descriptive material comprising a set of constraints by performing operations to determine a problem solution that satisfies the constraints.

In a preferred embodiment, functional descriptive material is read into main memory 106 from a storage device 108 prior to being processed. Storage device 108 may be a tape drive, disk drive, or any other kind of device that reads or writes data to/from an associated computer-readable medium.

An input/output (I/O) bridge 110 connects local bus 102 to an input/output (I/O) bridge 112. I/O bridge 112 in turn connected via PCI bus bridges 114 to PCI backplane buses 116. PCI backplane buses 116 provide the interface to I/O devices such as storage device 108 and I/O devices 118.

In a preferred embodiment of the present invention, I/O devices 118 are testing devices that stress test computer system 100 by performing a series of direct memory access (DMA) transfers of blocks of memory to and from cache memory 104 (and by implication main memory 106). I/O devices 118 perform repeated DMA transfers while varying transfer parameters pseudo-randomly so as to simulate the behavior of many different types of I/O devices. Also, processors 101 may also access cache memory 104 concurrently, so as to place further stress on computer system 100. The resulting contents of cache memory 104 and/or main memory 106 can then be examined to observe the effects of varying DMA parameters and concurrent memory access between I/O devices 118 and processors 101. DMA transfer parameters that may be varied include start address alignment, transfer size, transfer width, byte lane enables, request assertion time, request deassertion time, number of wait states, number of idle states, disconnect count, retry limit, bus commands, and whether to override a latency timer. In addition, I/O devices 118 may issue any other possible bus commands.

Several of the parameters that may be varied refer to characteristics of the data to be transmitted. Start address alignment refers to the relationship between the starting address of the memory block to be transferred and the structure of cache memory 104 and main memory 106. Cache memory 104 is preferably divided into equal-length segments known as cache sectors; the sectors are preferably subdivided into cache lines. Main memory 106, likewise, is divided into large pages, which are subdivided into pages. The start address alignment of a series of DMA transfers can be varied so as to place the starting address at the beginning of any one of these units. For example, a first DMA transfer may be made with a starting address that begins a cache sector, with a second DMA transfer made with a starting address that begins a cache line somewhere within the interior of a cache sector.

The transfer size is, as the name suggests, the size of a block of data to be transferred to/from memory. A transfer size may be made to span multiple cache lines or simply a portion of a cache line, for instance. Transfer width refers to how many bits in a bus will be utilized. PCI buses, for instance, allow for 64 bit wide transfers, although it is common to use only 32 bits. Related to the concept of bus width is the enablement of byte lanes. A byte lane is an eight-bit-wide portion of the signals in a bus. For example, in a 32-bit bus, there are four byte lanes, since each byte lane contains 8 bits of signals. Different ones of I/O devices 118 may be enabled to use different byte lanes on the same bus concurrently, so as to allow for parallel transmission of data to/from I/O devices 118. One or more of processors 101 may also make use of enabled byte lanes.

This division of the bus into byte lanes can allow what are known as "false sharing" and "true sharing" to take place. False sharing occurs when different entities (i.e., I/O devices and processors) have distinct byte lanes enabled, but write to the same contiguous block of memory. True sharing occurs when different entities may share the same byte lane. Thus, enabling byte lanes allows the effects of false sharing and true sharing to be tested for.

Various timing parameters may also be varied. Request assertion time refers to how long an I/O device spends requesting that a bridge (e.g., one of PCI bus bridges 114) grant the I/O device bus access as the bus master. Request deassertion time refers to the length of time the I/O device spends relinquishing the bus access. These signal variations enable the stressing of the bridge's arbitrator module. Idle states are clock cycles during which the I/O device transfers no data, although data is available for transfer. Wait states are clock cycles that take place before transfer begins, but after an I/O device has taken control of a bus; wait states are generally used to prepare data for transfer. Some I/O devices, such as those designed to be used with PCI buses, make use of a latency timer, which provides a time limit as to how long an I/O device may remain in control of a bus. I/O devices 118 can be made to ignore the latency timer. In a related vein, some buses make use of a disconnect count, in which an I/O device relinquishes control of the bus after so many bytes (the disconnect count amount) are transferred, even though additional bytes may be available. The disconnect count can be varied as well.

Some bus protocols allow a target device, addressed by a master device issuing the DMA transfer when not ready with the data, to issue what is called a "retry." The master can, in response, reissue the same DMA request immediately, issue another DMA request, or give up on that transaction. The master device can implement a retry counter, which can be used to decide to either retry the DMA transaction immediately or retry it later (when a certain count, the "retry limit," is reached). This retry limit can also be varied.

Figure 2:
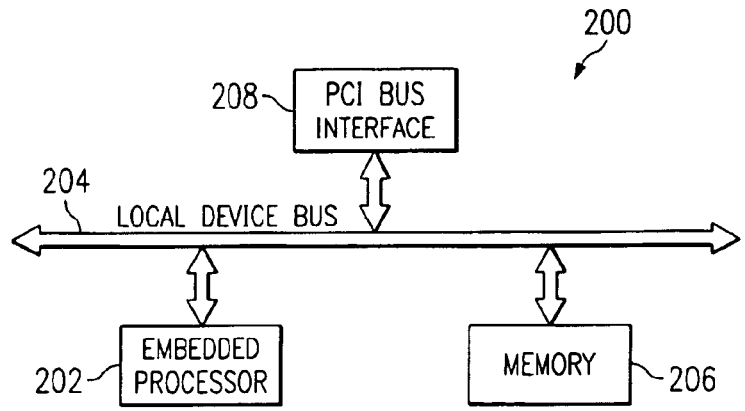
FIG. 2 is a block diagram of an input/output device in accordance with a preferred embodiment of the present invention.

FIG. 2 is a block diagram of an I/O device 200 for stress testing a computer system in accordance with a preferred embodiment of the present invention. I/O device 200 could be, for instance, one of I/O devices 118 in FIG. 1. Embedded processor 202 resides on local device bus 204, through which it accesses memory 206. Memory 206 stores functional descriptive material that defines the operation of I/O device 200. Memory 206 is preferably some kind of non-volatile memory for storing functional descriptive material as firmware. The functional descriptive material contained in memory 206 enables embedded processor 202 to engage in DMA writes and reads to computer system memory through PCI bus interface 208. Embedded processor 202 randomizes DMA transfer parameters and conducts repetitive DMA transfers. The operation of I/O device 200 according to the functional descriptive material in memory 206 is further described in FIGS. 3 and 4.

Figure 3:
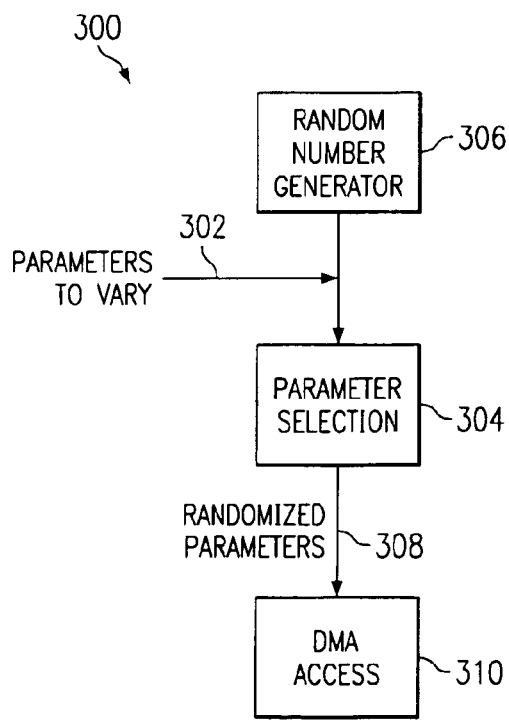
FIG. 3 is a functional block diagram of a process of randomizing DMA transfer parameters in a preferred embodiment of the present invention.

FIG. 3 is a functional block diagram depicting a process of randomization of DMA transfer parameters 300 in an I/O device in accordance with a preferred embodiment of the present invention. The steps depicted in FIG. 3 are preferably performed as steps in a software program incorporated into functional descriptive material stored in memory 206 or I/O device 200. Which parameters are to be randomized (302) is provided as input to the I/O device from software operating on at least one of processors 101 (FIG. 1). Parameter selection code 304 selects values for the varied parameters based on random numbers provided by random number generator 306, which may be implemented in hardware or software. The randomized DMA transfer parameters (308) are then provided as input to DMA access code 310, which effects a DMA transfer (i.e., a write or read) according to the provided parameters. The results of false/true sharing done between processors 101 and the DMA from I/O device 200, are verified by software operating on processors 101.

Figure 4:
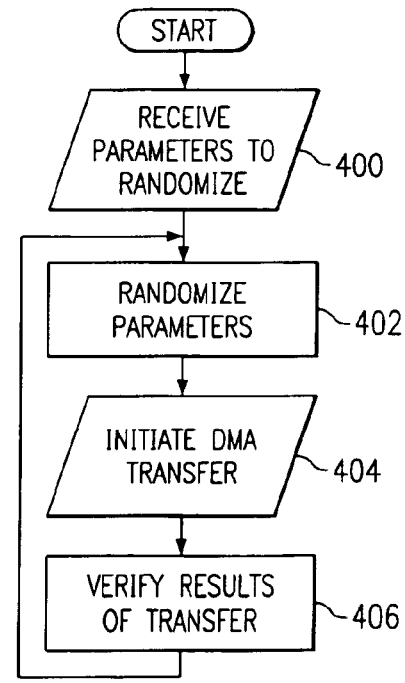
FIG. 4 is a flowchart representation of a process of executing repeated DMA transfers with pseudo-randomly varied transfer parameters.

FIG. 4 is a flowchart representation of a process of making DMA transfers to/from an input/output device with randomized parameters in accordance with a preferred embodiment of the present invention. First, the parameters to be randomized are received from computer system software (step 400). Next, pseudo-random values for DMA parameters for a subsequent transfer are generated (step 402). Once the parameters are setup, the input/output device (step 404) executes the DMA transfer (read or write). Finally, the results of the DMA transfer are verified (step 406), and the process cycles back to step 402 for generation of further DMA transfers. It is important to note that while the present invention has been described in the context of a fully functional data processing system, those of ordinary skill in the art will appreciate that the processes of the present invention are capable of being distributed in the form of a computer readable medium of functional descriptive material in a variety of forms and that the present invention applies equally regardless of the particular type of signal bearing media actually used to carry out the distribution. Examples of computer readable media include recordable-type media, such as a floppy disk, a hard disk drive, a RAM, CD-ROMs, DVD-ROMs, and transmission-type media, such as digital and analog communications links, wired or wireless communications links using transmission forms, such as, for example, radio frequency and light wave transmissions. The computer readable media may take the form of coded formats that are decoded for actual use in a particular data processing system.

The description of the present invention has been presented for purposes of illustration and description, and is not intended to be exhaustive or limited to the invention in the form disclosed. Many modifications and variations will be apparent to those of ordinary skill in the art. The embodiment was chosen and described in order to best explain the principles of the invention, the practical application, and to enable others of ordinary skill in the art to understand the invention for various embodiments with various modifications as are suited to the particular use contemplated.

What is claimed is:

1. A method operative in an input/output device associated with a computer system, comprising:

performing, using a device having an embedded processor, a plurality of direct memory access transfers with respect to memory of the computer system, wherein parameters of the direct memory access transfers are varied pseudo-randomly;

wherein the direct memory transfers are performed concurrently with memory accesses by a processor in the computer system other than said embedded processor.

2. The method of claim 1, wherein the parameters include start address alignment.

3. The method of claim 1, wherein the parameters include transfer size.

4. The method of claim 1, wherein the parameters include at least one of transfer width and byte lane enables.

5. The method of claim 1, wherein the parameters include at least one of request assertion time, request deassertion time, number of wait states, number of idle states, disconnect count, retry limit, and whether to override a latency timer.

6. The method of claim 1, further including performing additional bus commands.

7. The method of claim 6, wherein the additional bus commands include all possible bus commands.

8. The method of claim 1, wherein the memory includes cache memory.

9. A method operative in an input/output device associated with a computer system, comprising:

performing a plurality of direct memory access transfers with respect to memory of the computer system, wherein parameters of the direct memory access transfers are varied pseudo-randomly;

wherein a processor and the input/output device access memory locations concurrently within a same block of memory.

10. The method of claim 9, wherein the processor and the input/output device access a same memory location.

11. A computer program product in computer readable medium and operative in an input/output device associated with a computer system, comprising functional descriptive material that when processed by an input/output device, enables the input/output device to perform acts of:

performing, using a device having an embedded processor, a plurality of direct memory access transfers with respect to memory of the computer system, wherein parameters of the direct memory access transfers are varied pseudo-randomly;

wherein the direct memory transfers are performed concurrently with memory accesses by a processor in the computer system other than said embedded processor.

12. The computer program product of claim 11, wherein the parameters include start address alignment.

13. The computer program product of claim 11, wherein the parameters include transfer size.

14. The computer program product of claim 11, wherein the parameters include at least one of transfer width and byte lane enables.

15. The computer program product of claim 11, wherein the parameters include at least one of request assertion time, request deassertion time, number of wait states, number of idle states, disconnect count, retry limit, and whether to override a latency timer.

16. The computer program product of claim 11, wherein the functional descriptive material enables the computer to perform additional acts including performing additional bus commands.

17. The computer program product of claim 16, wherein the additional bus commands include all possible bus commands.

18. The computer program product of claim 11, wherein the memory includes cache memory.

19. A computer program product in a computer readable medium and operative in an input/output device associated with a computer system, comprising functional descriptive material that when processed by an input/output device, enables the input/output device to perform acts of:

performing a plurality of direct memory access transfers with respect to memory of the computer system, wherein parameters of the direct memory access transfers are varied pseudo-randomly;

wherein a processor and the input/output device access memory locations concurrently within a same block of memory.

20. The computer program product of claim 19, wherein the processor and the input/output device access a same memory location.

21. An input/output device comprising means for:

performing a plurality of direct memory access transfers with respect to memory of a computer system by the input/output device, wherein parameters of the direct memory access transfers are varied pseudo-randomly;

wherein the direct memory transfers are performed concurrently with memory access by a processor in the computer system.

22. The input/output device of claim 21, wherein the parameters include start address alignment.

23. The input/output device of claim 21, wherein the parameters include transfer size.

24. The input/output device of claim 21, wherein the parameters include at least one of transfer width and byte lane enables.

25. The input/output device of claim 21, wherein the parameters include at least one of request assertion time, request deassertion time, number of wait states, number of idle states, disconnect count, retry limit, and whether to override a latency timer.

26. The input/output device of claim 21, further comprising means for performing additional bus commands.

27. The input/output device of claim 26, wherein the additional bus commands include all possible bus commands.

28. The input/output device of claim 21, wherein the processor and the input/output device access memory locations within a same block of memory.

29. The input/output device of claim 21, wherein the processor and the input/output device access a same memory location.

30. The input/output device of claim 21, wherein the memory includes cache memory.

31. A computer system comprising:

memory;

a first processor associated with said memory;

at least one peripheral device containing an embedded processor and configured to be able to access said memory; and functional descriptive material within the memory, wherein said first processor processes the functional descriptive material to perform acts of:

directing the at least one peripheral device to use said embedded processor to perform direct memory access transfers with respect to the memory and with pseudo-random variations in direct memory access transfer parameters; and accessing a portion of the memory concurrently with the at least one peripheral device.

* * * * *

UNITED STATES PATENT AND TRADEMARK OFFICE
CERTIFICATE OF CORRECTION

PATENT NO. : 6,898,734 B2  
APPLICATION NO. : 10/015229  
DATED : May 24, 2005  
INVENTOR(S) : Kapoor et al.

Page 1 of 1

It is certified that error appears in the above-identified patent and that said Letters Patent is hereby corrected as shown below:

OTHER PUBLICATIONS, Line 2: after "Hardware" delete "Stimulator and insert --Simulator --.

Signed and Sealed this

Fifth Day of September, 2006

JON W. DUDAS  
*Director of the United States Patent and Trademark Office*